United States Patent
Dedieu et al.

(10) Patent No.: US 7,265,636 B2
(45) Date of Patent: Sep. 4, 2007

(54) METHOD OF CORRECTING THE PHASE DIFFERENCE BETWEEN TWO INPUT SIGNALS OF A PHASE-LOCKED LOOP AND ASSOCIATED DEVICE

(75) Inventors: Sébastien Dedieu, Crolles (FR); Frédéric Paillardet, Aix les Bains (FR); Gérald Provins, Domene (FR)

(73) Assignee: STMicroelectronics SA, Montrouge (FR)

( * ) Notice: Subject to any disclaimer, the term of this patent is extended or adjusted under 35 U.S.C. 154(b) by 81 days.

(21) Appl. No.: 11/304,382

(22) Filed: Dec. 15, 2005

(65) Prior Publication Data

US 2006/0132245 A1    Jun. 22, 2006

(30) Foreign Application Priority Data

Dec. 16, 2004   (FR)   .................................. 04 13434

(51) Int. Cl.
    *H03L 7/00*   (2006.01)
(52) U.S. Cl. .......................... 331/17; 331/1 A; 331/34; 331/16; 327/156; 327/157; 327/158; 327/159
(58) Field of Classification Search ................ 331/1 A, 331/17, 16, 34; 327/156, 157, 158, 159
    See application file for complete search history.

(56) References Cited

U.S. PATENT DOCUMENTS 6,943,600 B2 *   9/2005   Craninckx .................. 327/157

2003/0227332 A1 *  12/2003  Lee et al. ..................... 331/17

FOREIGN PATENT DOCUMENTS

| EP | 0 561 526 | 9/1993 |
|----|-----------|--------|
| FR | 2 754 959 | 10/1996 |

* cited by examiner

*Primary Examiner*—Arnold Kinkead
(74) *Attorney, Agent, or Firm*—Lisa K. Jorgenson; Allen, Dyer, Doppelt, Milbrath & Gilchrist, P.A.

(57) ABSTRACT

A method for correcting the phase difference between two input signals of a phase-locked loop may include a charge pump connected to a filter. Prior to the occurrence of the first of the two input signals, a calibration phase may be carried out in which the input of the filter is disconnected from the output of the charge pump, the output voltage from the charge pump is equalized, to within a given error, with the input voltage of the filter, the amplitudes of the opposing currents flowing in the charge pump being equalized. Then, during the two respective occurrences of the two input signals, the input of the filter is reconnected to the output of the charge pump, and two phase-shifted signals that are delayed with respect to the input signals are respectively generated, in response to which the two opposing currents are, respectively and successively, interrupted, before the calibration phase is recommenced.

19 Claims, 10 Drawing Sheets

US 7,265,636 B2

METHOD OF CORRECTING THE PHASE DIFFERENCE BETWEEN TWO INPUT SIGNALS OF A PHASE-LOCKED LOOP AND ASSOCIATED DEVICE

FIELD OF THE INVENTION

The invention relates to the correction of the phase difference between two signals by using a phase-locked loop.

BACKGROUND OF THE INVENTION

A conventional phase-locked loop is formed by a phase/frequency discriminator connected to a charge pump delivering a voltage to a voltage-controlled oscillator via a filter. The output voltage of the oscillator is delivered to the input of the phase/frequency discriminator via a feedback loop comprising, for example, a divider by N.

The phase/frequency discriminator compares the phase of a reference signal that it receives at its input and the phase of the output signal from the voltage-controlled oscillator, whose frequency is divided by the divider by N of the feedback loop. In another variant, the frequency of the oscillator output signal can also be transposed by using a mixer. The reference signal can, for example, be generated by a quartz oscillator or by another phase-locked loop. Following the comparison, the discriminator generates current pulses, called 'positive' and 'negative' pulses, whose difference is proportional to the phase difference.

When the positive pulse is at the high logic level, the positive current generated by the charge pump is delivered to the capacitor of the filter connected between the charge pump and the voltage-controlled oscillator such that the output voltage of the filter increases. On the other hand, when the negative pulse is at the high logic level, the negative current from the charge pump is recovered from the filter capacitor such that the filter voltage decreases.

When the two pulses, positive and negative, are simultaneously at the high level, the positive and negative currents cancel, and no current is then either delivered to the filter or flows. When the two pulses, positive and negative, are at the low logic level, the charge pump current sources are then disconnected.

In other words, the charge pump and the filter operate as a digital/analogue converter. The charge pump produces two similar output currents, a positive current and a negative current. The charge pump receives a current when the negative pulse delivered by the phase/frequency discriminator is at its high level and delivers the same current when the positive pulse delivered by the low-frequency discriminator is active. No current flows if the two pulses are at the same logic level, state another way, if the negative and positive currents of the charge pump are exactly equal.

As the frequencies of the two signals, in other words of the reference signal and of the divided signal, tend to equality, the positive and negative pulses delivered by the discriminator become closer and closer and the integration performed by the filter reduces the phase difference to zero. At that moment, no signal is delivered by the discriminator, and the voltage-controlled oscillator is effectively disconnected. This situation is undesirable, since the total gain of the phase-locked loop is reduced to zero, and it then finds itself in a region referred to as a 'dead band', within which phase difference correction is no longer effected.

The ideal situation consists of a point-like dead band. However, in practice, this case never occurs given that the switching times of the components are not equal and take place over a given time. In reality, the dead band therefore continues for a certain duration.

In order to pre-empt this critical situation, a first approach involves connecting a leakage resistor of a given value in parallel with the integration capacitor of the filter. However, a resistor with too high a value leads to a higher voltage noise level, which becomes a phase noise at the output of the voltage-controlled oscillator. This approach is therefore not usable in the case of small phase differences between the input signals.

On the other hand, a leakage resistor whose value is not high enough leads to the appearance of spurious frequency lines on either side of the carrier frequency. The reason for this is that by reducing the value of the resistor, the noise is indeed reduced, but the current flowing in this resistor is higher. This current integrated by the capacitor Cf of the filter induces a modulation of the filter voltage that generates a frequency modulation at the output of the voltage-controlled oscillator.

Another approach involves introducing a delay within the phase/frequency discriminator. In this case, the principle involves making the positive and negative pulses delivered by the charge pump go to the high logic level when the respective edges of the reference signal and of the divided signal occur. The positive and negative pulses return to the low level at the end of a predetermined delay.

However, during the time when the pulses are at the logic high level, the charge pump current sources are conducting. Since the sources are never exactly matched, their difference generates a small current that induces a modulation of the filter voltage. As before, this phenomenon is converted into a frequency modulation at the output of the voltage-controlled oscillator.

In addition, each of the aforementioned approaches requires an additional period of injection and/or withdrawal of current from which an additional voltage noise from the filter is generated.

SUMMARY OF THE INVENTION

It is therefore an object of the invention to correct the foregoing problems by improving the correction of the phase difference between two input signals of a phase-locked loop, especially for small phase differences, while at the same time limiting the spurious noise generated by the currents delivered by the charge pump. For this purpose, according to one embodiment, the invention may provide a method for correcting the phase difference between two input signals of a phase-locked loop comprising a charge pump connected to a filter.

According to a general feature of this embodiment of the invention, prior to the occurrence of the first of the two input signals, a calibration phase may be carried out in which the input of the filter is disconnected from the output of the charge pump, the output voltage from the charge pump is equalized, to within a given error, with the input voltage of the filter, the amplitudes of the opposing currents flowing in the charge pump being equalized, and then, during the two respective occurrences of the two input signals, the input of the filter is reconnected to the output of the charge pump, and two signals that are delayed with respect to the input signals are respectively generated, in response to which the two opposing currents are, respectively and successively, interrupted before the calibration phase recommenced.

In other words, the charge pump currents may take a non-zero predetermined value, up until the moment when the arrival of the two signals, the reference signal and the signal coming from the divider, cause the two current sources to be interrupted, for example. In contrast, in the existing approaches of the prior art, the currents are already zero and then successively go to a non-zero value so as to generate a pulse. However, given that the values of each current cannot, in practice, be exactly identical, the difference in current generates spurious noise. By contrast, according to the invention, since the device charge pump currents may take a zero value upon the arrival of the two signals, the spurious noise becomes almost non-existent.

The method according to the invention may have the advantage of limiting the spurious noise caused by the difference between the positive and negative charge pump currents, since the charge pump currents may be interrupted upon the arrival of the reference signal and that from the divider, and therefore their amplitude is zero. In addition, given that a leakage resistor may no longer be used, very small phase differences can be corrected without the appearance of spurious frequency lines.

The noise may be especially attenuated within a frequency band of amplitude twice the cut-off frequency of the charge pump and centred around the carrier frequency. In other words, the noise from charge pump may be greatly diminished.

The disconnection and the connection of the filter from and to the charge pump may be advantageously carried out gradually over a time τr that is less than the delay of the delayed phase-shifted signals, for example. This gradual connection and disconnection of the filter to and from the charge pump may limit the appearance of spurious frequency lines on either side of the carrier frequency.

According to one embodiment, the invention may also provide a phase-locked loop device comprising two inputs for receiving two input signals, a charge pump connected between the two inputs, and a filter, for example. According to a general feature of this embodiment, the device may comprise a calibrator or calibration means capable of being activated by an activation signal and deactivated by a deactivation signal, and capable of equalizing, to within a given error, the output voltage of the charge pump with the input voltage of the filter and also the amplitudes of the opposing currents flowing in the pump. The device may also comprise a controller or control means including a delay cell for delivering two delayed signals starting from the input signals, and a control circuit capable, in the presence of the two delayed signals, of delivering, respectively and successively, two interruption signals to the charge pump in order to cause the respective, successive interruptions of the two opposing currents. The controller or control means may also include an activation/deactivation unit capable of delivering the activation signal prior to each occurrence of the first of the two signals and the deactivation signal following the interruptions.

According to one embodiment, the calibrator or calibration means may be integrated into the charge pump and may comprise an amplifier whose positive and negative inputs are respectively connected to the output node of the charge pump and to the input of the filter, and a switch controlled by the activation signal, for example. The calibrator or calibration means may comprise a switch controlled by the deactivation signal and a switch controlled by one of the interruption signals, with the switches being capable of connecting and disconnecting the output of the amplifier to/from the control input of the negative current source.

According to one embodiment, the activation/deactivation unit may be connected to the input of the charge pump and may comprise a first phase/frequency discriminator and an edge control module capable of delivering the activation signal and deactivation signal, for example.

According to one embodiment, the charge pump may comprise a first transistor configured as a current source, capable of delivering the first current, and connected between a power supply voltage and the output of the charge pump, for example. The control input of the transistor may be connected via a first switch to the power supply voltage and via a second switch to a controllable current source, with the two switches being controlled by one of the interruption signals.

According to one embodiment, the charge pump may comprise a second transistor configured as a current source, capable of delivering the second current, and connected between the output of the charge pump and ground, for example. The control input may be connected to ground via a switch controlled by the other interruption signal.

According to one embodiment, the delay cell may comprise two distinct modules capable of generating two different delays for each of the input signals, for example. According to one embodiment, the delay cell may comprise two distinct modules capable of generating the delays of each of the input signals, with one of the delays being fixed and the other being adjustable, for example.

According to one embodiment, the first transistor may be a pMOS transistor. According to one embodiment, the second transistor may be an nMOS transistor. The invention may be advantageously used for, but is not limited to, applications associated with digital television.

BRIEF DESCRIPTION OF THE DRAWINGS

Other advantages and features of the invention will become apparent upon examining the detailed description of non-limiting embodiments and their implementation, and of the appended drawings, in which.

DETAILED DESCRIPTION OF THE PREFERRED EMBODIMENTS

Figure 1:
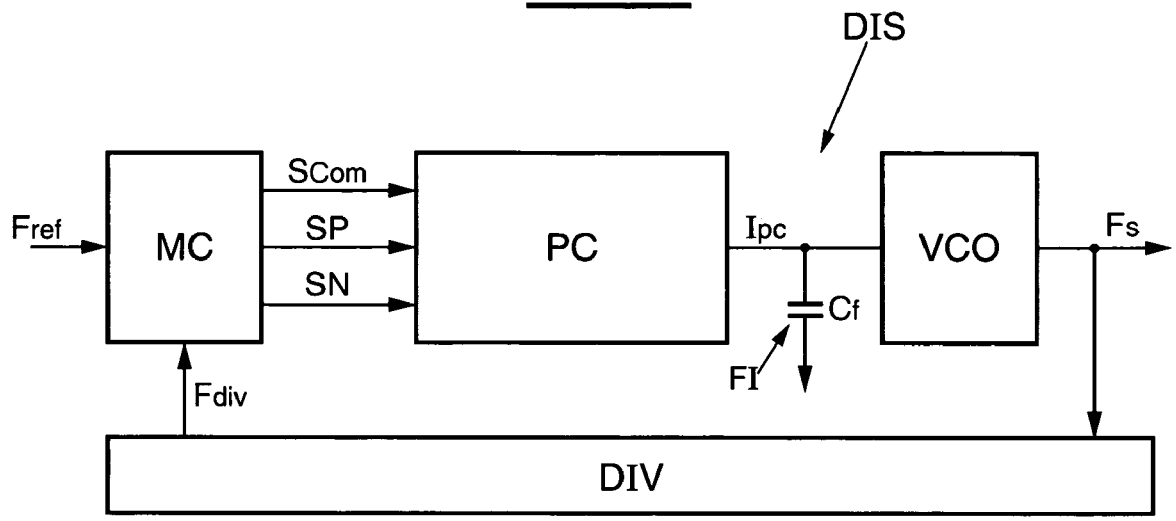
FIG. 1 describes one embodiment of a device for correcting the phase difference between two input signals of a phase-locked loop in accordance with the invention.

FIG. 1 illustrates an exemplary embodiment of a device DIS for correcting the phase difference between two input signals of a phase-locked loop according to the invention. The device DIS comprises a controller or control means MC receiving a reference frequency $F_{ref}$ at its input. The reference frequency $F_{ref}$ can, for example, be generated by a quartz oscillator or else by another phase-locked loop connected upstream of the device DIS. For digital television applications, $F_{ref}$ can be around 2.7 MHz, for example.

The controller or control means MC generates three signals at its output, an activation signal which in this example is a switching signal $S_{com}$, a signal called 'positive signal' SP, and a signal called 'negative signal' SN. An inverter (not shown) produces from the signal $S_{com}$ a deactivation signal $\overline{S_{com}}$, which is the complementary signal to the signal $S_{com}$.

The three signals $S_{com}$, SP, and SN are delivered to a charge pump PC connected to the controller or control means MC. The charge pump PC then delivers a current $I_{pc}$, which, when integrated by the capacitor Cf of the filter, supplies the control voltage to the oscillator VCO. The latter then delivers an output signal at a frequency $F_s$. The voltage-controlled oscillator VCO is furthermore fed back onto the control means MC via a divider by N DIV which delivers a divided signal $F_{div}$ to the controller or control means MC.

Figure 2:
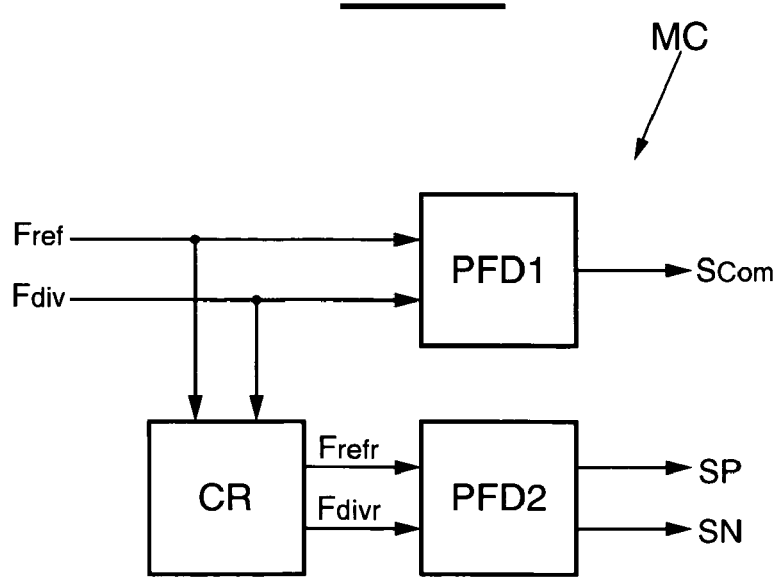
FIG. 2 describes one embodiment of a controller or control means shown in FIG. 1.

Reference is now made to FIG. 2, which describes more precisely the structure of the controller or control means MC. The controller or control means MC receives the reference signal $F_{ref}$ at its input, together with the signal coming from the divider by N DIV in the feedback loop $F_{div}$. The two signals $F_{ref}$ and $F_{div}$ are delivered to an activation/deactivation unit BAD and, more particularly, to a first phase/frequency discriminator PFD1 included in the activation/deactivation unit BAD. The activation/deactivation unit BAD delivers the switching signal $S_{com}$ at its output. Its operation will be described hereinafter in more detail.

The controller or control means MC also comprises a delay cell CR which receives the two signals $F_{ref}$ and $F_{div}$ at its input. The delay cell CR delivers two signals $F_{refr}$ and $F_{divr}$ at its output, which correspond to the two input signal $F_{ref}$ and $F_{div}$ delayed by a predetermined delay $\tau_d$. The determination of the value of the delay will be explained hereinafter in more detail.

The controller or control means MC comprises a control unit PFD2 which here is a second phase/frequency discriminator receiving the two delayed signals $F_{refr}$ and $F_{divr}$ at its input. From these two signals, the discriminator PFD2 generates the two control signals, positive SP and negative SN, respectively. The operation of the discriminator PFD2 will be described hereinafter in more detail.

Figure 3:
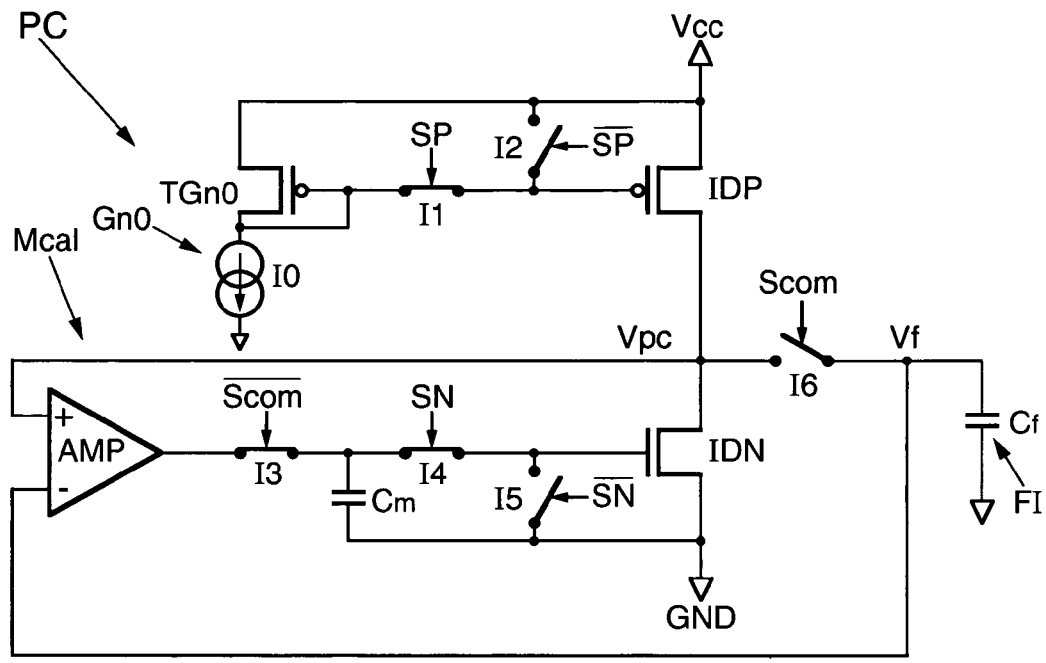
FIG. 3 illustrates schematically one embodiment of the charge pump shown in FIG. 1.

The control signals SP and SN and the switching signal $S_{com}$ are delivered to the charge pump PC shown in FIG. 3. The charge pump comprises two current sources, positive IDP and negative IDN, respectively, that are capable of delivering two opposing currents. The positive current source IDP is formed from a pMOS transistor whose source is connected to a DC voltage Vcc and drains to the negative current source IDN. The gate of the pMOS transistor IDP is connected via a switch I1 to a current generator Gn0 formed, in this example, from a current source I0 and from a transistor TGn0. The switch I1 is controlled by the positive control signal SP and may be formed from a MOS transistor, as may all the other switches mentioned hereinafter. More precisely, the current source I0 here is connected between ground and the source of the transistor TGn0, with the source being fed back onto the gate of the transistor TGn0.

The negative voltage source IDN of the charge pump PC is formed, in this example, by means of an nMOS transistor. The drain of the transistor IDN is connected to the drain of the transistor IDP. The voltage common to the two transistors is denoted $V_{pc}$. Furthermore, the source of the transistor IDN is connected to ground GND. The current sources may also be formed with the addition of a resistor (not shown) between the sources of the transistors IDP and IDN and the power supply voltage so as to further reduce the spurious noise.

Another way of forming the charge pump current sources that is known to those skilled in the art includes adding a MOS transistor (not shown) between each drain of the transistors IDP and IDN, or only between the drain of one of the transistors and the node at the potential $V_{pc}$, which adds an extra drain-source resistor. However, this transistor can limit the dynamic range of the potential $V_{pc}$.

The charge pump PC also comprises a calibrator or calibration means $M_{cal}$, which includes an operational amplifier AMP with a gain A. The positive input of the amplifier AMP is connected to the voltage $V_{pc}$, while the negative input is connected to the input of the filter FI.

The output of the operational amplifier AMP is connected to the gate of the transistor IDN via a first transistor I3 controlled by the complement of the switching signal $S_{com}$, and by a second switch I4 controlled by the opposing signal to the negative control signal SN. A capacitor $C_m$ is connected between the two switches I3 and I4 and ground GND. In addition, a switch I5 controlled by the negative control signal SN and parallel to the capacitor $C_m$ connects the gate of the transistor IDN to ground GND.

The node common to the two current sources IDP and IDN is connected to the filter FI via a switch I6 controlled by the switching signal $S_{com}$. The voltage at the input of the filter FI is denoted $V_f$.

Figure 4:
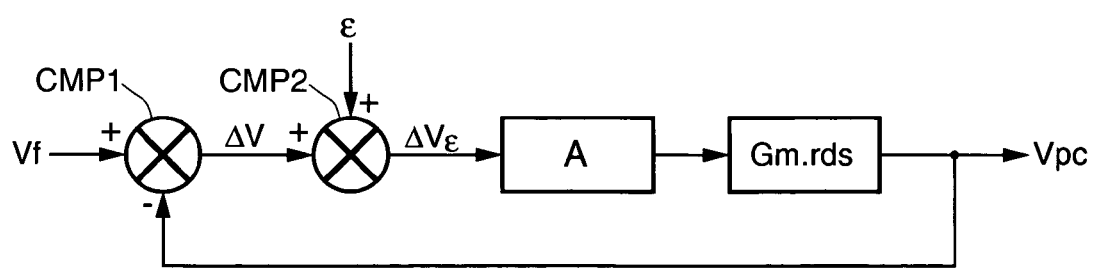
FIG. 4 shows a functional diagram of the calibrator or calibrator means shown in FIG. 3.

The operation and the action of the calibrator or calibration means $M_{cal}$ can be summarised by the functional diagram in FIG. 4. The input voltage of the filter FI, $V_f$ is delivered to a first comparator CMP1. The common drain voltage of the two charge pump current sources, $V_{pc}$, is then subtracted from this. An offset ϵ generated by the amplifier AMP is added to the resultant voltage obtained ΔV. The value $ΔV_ϵ$ is then multiplied by the gain of the amplifier A, then by the gain characteristic Gm and drain/source resistance characteristic rds of the transistor IDN, so as to obtain the voltage $V_{pc}$.

Figure 5:
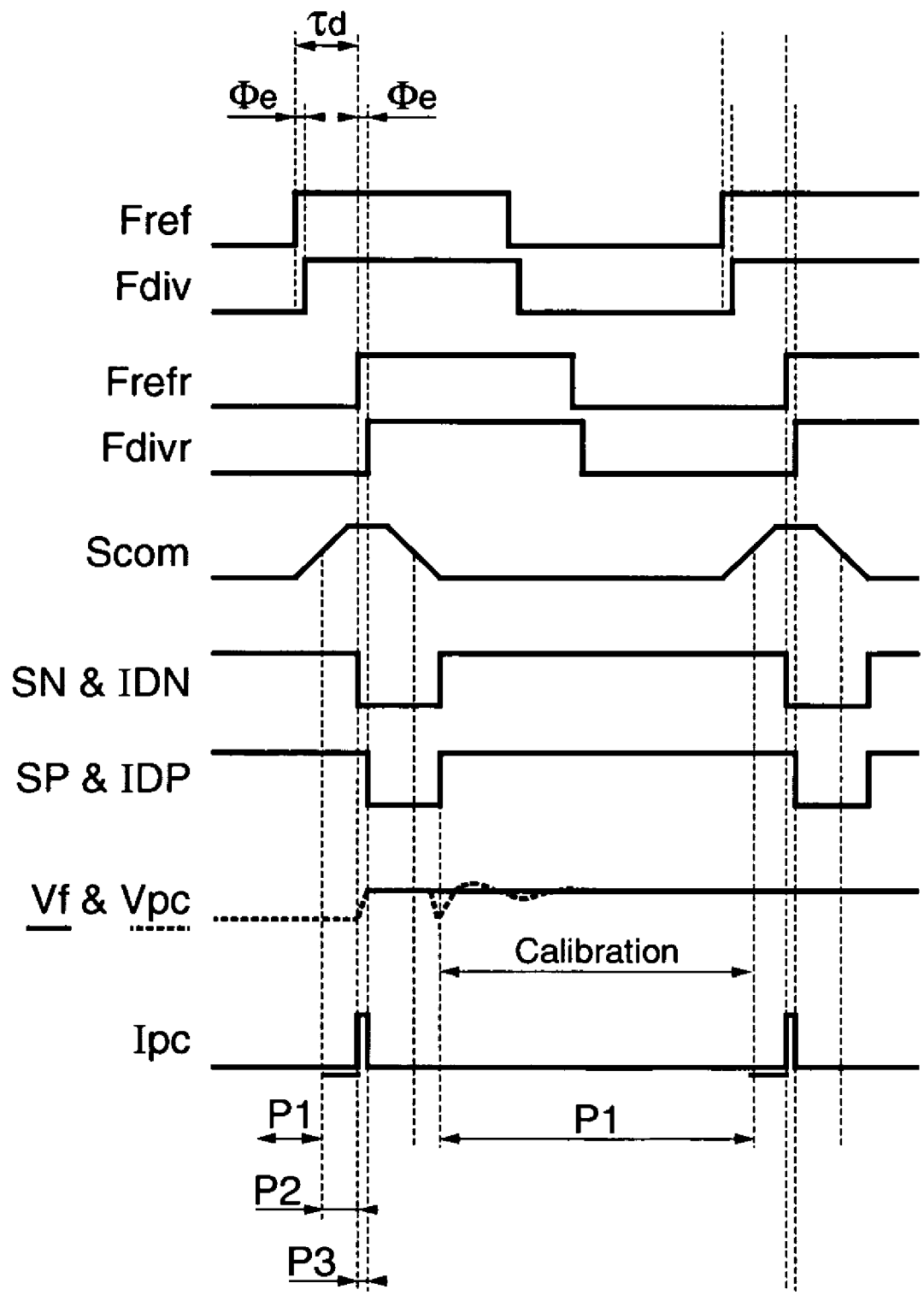
FIG. 5 shows a timing diagram of the operation during the first three phases of the device shown in FIG. 1.

Reference is now made to FIG. 5, whose timing diagram illustrates more precisely the operation of the controller or control means MC, of the charge pump PC, and, in particular, of the calibration means $M_{cal}$. During the first phase P1, the signals $F_{ref}$ and $F_{div}$ are delivered to the input of the phase-locked loop. In this example, the signal $F_{ref}$ is in advance with respect to the signal $F_{div}$. A phase difference $Φ_e$ therefore exists between the two input signals $F_{ref}$ and $F_{div}$.

Figure 6A:
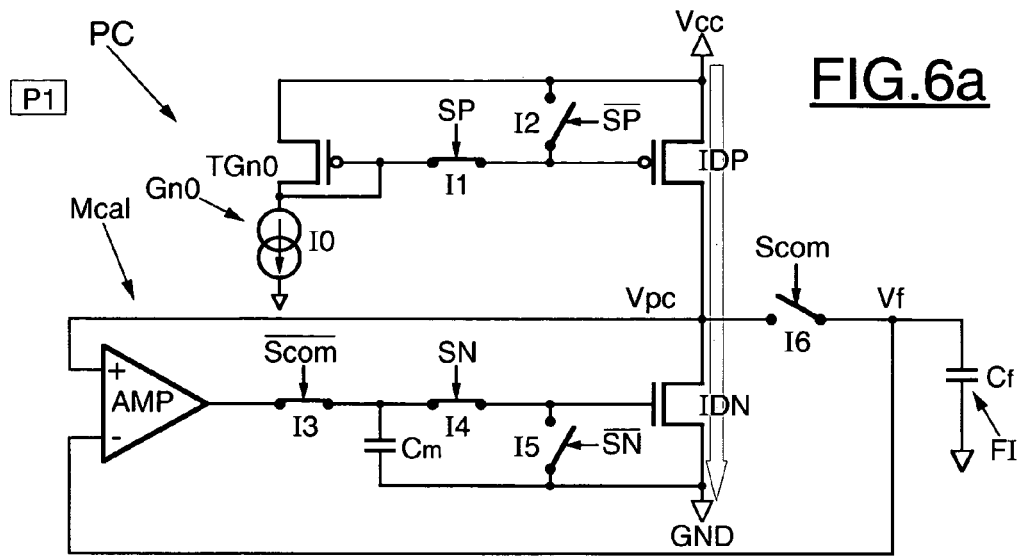
FIGS. 6a, 6b, and 6c illustrate the different states of the charge pump during the first three phases shown in the timing diagram in FIG. 5.

Upon receiving the first signal, here $F_{ref}$, the charge pump PC is gradually connected to the filter FI by closing the switch I6 that was initially open. The two nodes at the respective potentials $V_{pc}$ and $V_f$ are thus slowly connected together. However, the current delivered by the charge pump PC does not flow in the filter FI until the connection is completely established, as is shown in FIG. 6a illustrating the state of the charge pump PC during the phase P1. Since the currents IDN and IDP are the same, the gate voltage of the transistor IDN has been pre-calibrated such that the voltage $V_{pc}$ is equal to the voltage $V_f$. In this way, the mismatch between the two current sources that can occur when the switch I6 is closed is eliminated, whatever the value of the voltage $V_{pc}$. In addition, for frequencies below the calibration frequency, the calibration allows the low-frequency noise to be equalized for the two current sources.

Reference is again made to FIG. 5 for the second phase P2. During this phase P2, the amplifier AMP is disconnected by opening the switch I3. The voltage at the gate of the transistor IDN is then stored in the capacitor $C_m$. Subsequently, the switch I6 allows enough current to flow when the control voltage SCOM of the switch I6 is higher than a given voltage, which depends on the technology employed, and, notably, on the threshold voltage of the transistors used.

Figure 6B:
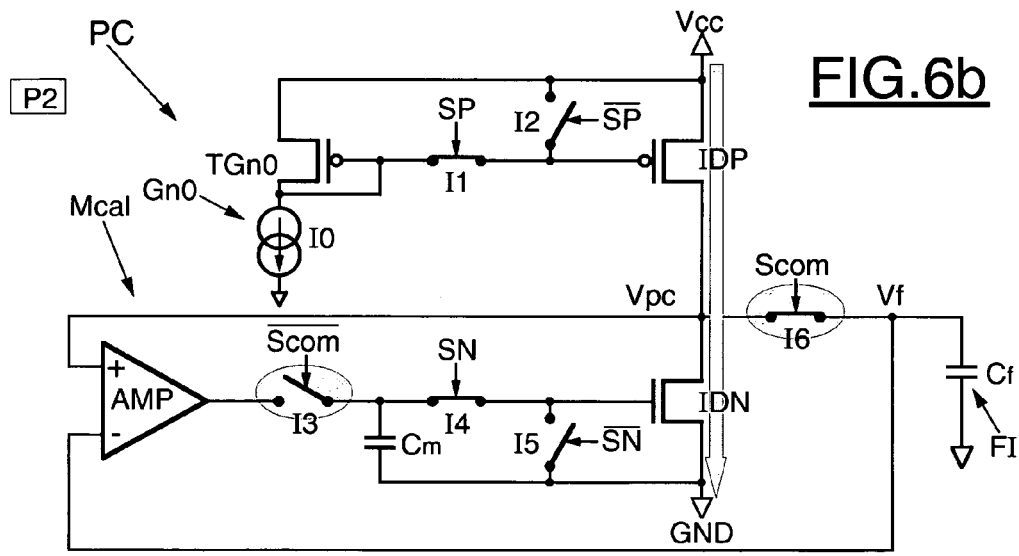

The connection between the output of the charge pump PC and of the filter FI is then established. Given that the voltages $V_{pc}$ and $V_f$ are equal, no current flows through the switch I6, as is indicated in FIG. 6b, which illustrates the phase P2. Furthermore, since the two current sources IDN and IDP are calibrated, no frequency noise below the calibration frequency is injected into the filter FI.

Figure 6C:
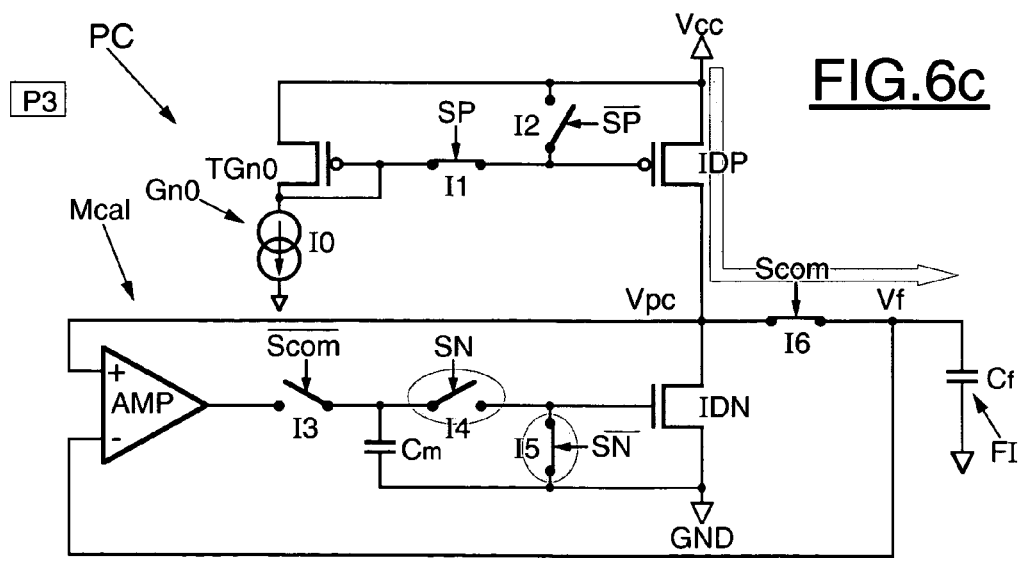

The phase P3, shown in FIG. 5, begins at the reception of the first delayed signal, in this example, $F_{refr}$. The current source associated with the delayed signal $F_{refr}$, in other words IDP, is then disconnected. As is shown in FIG. 6c, illustrating the phase P3, the current then flows from the charge pump PC towards the filter FI.

Figure 7:
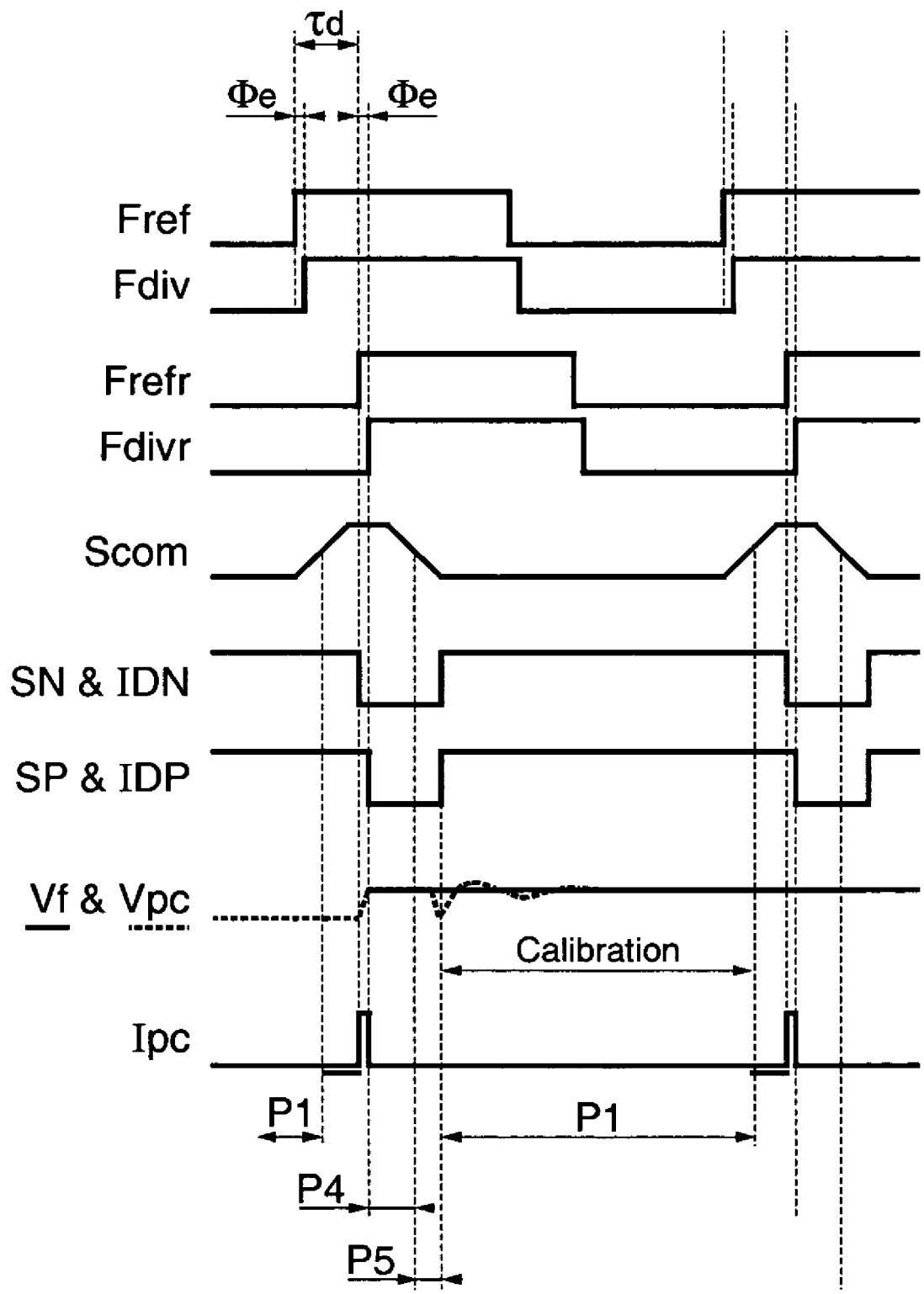
FIG. 7 illustrates the operational timing diagram of the device shown in FIG. 1 during the last phases.
Figure 8A:
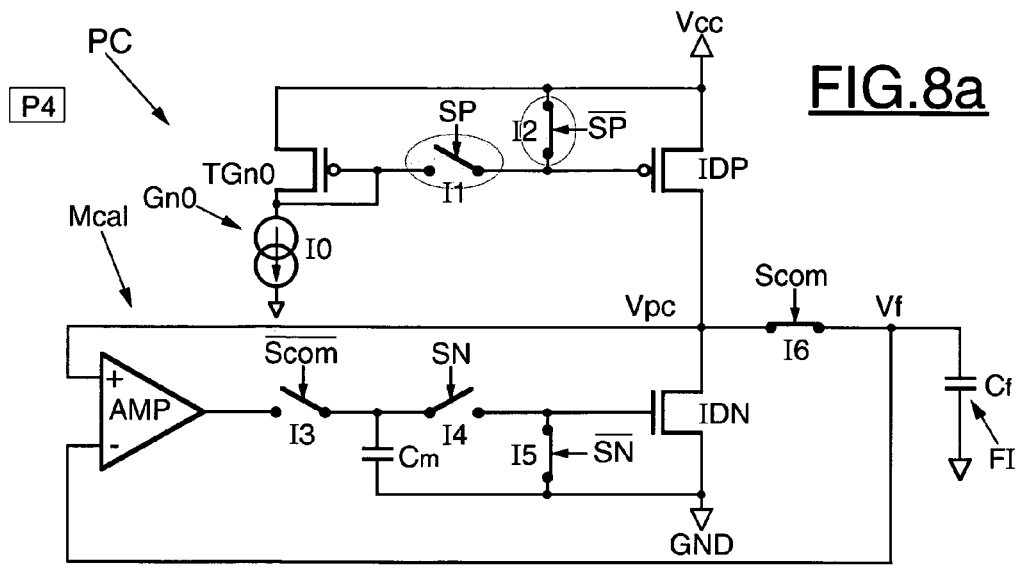
FIGS. 8a, 8b, and 8c illustrate the state of the charge pump during the last phases shown in the timing diagram in FIG. 7.

Reference is now made to FIG. 7, whose timing diagram notably features phase P4 of the operation of the device DIS. This phase begins at the reception of the second delayed signal, in this example $F_{divr}$. The second current source, here IDN, is then disconnected as can be seen in FIG. 8a. There is no longer either current or noise at the output of the charge pump PC.

Figure 8B:
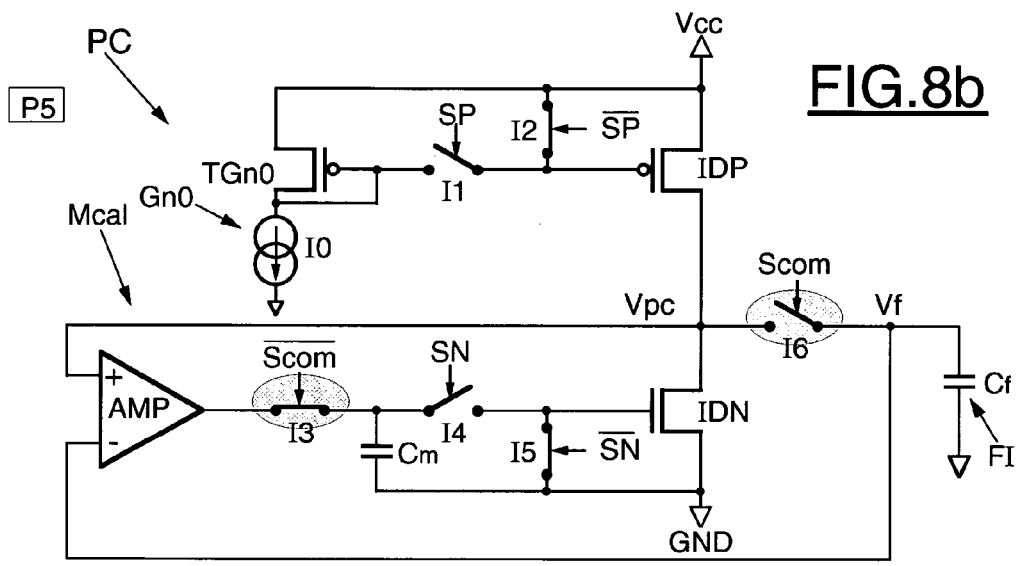

As illustrated in FIG. 7, opening of the switch I6 then begins. The disconnection is effective at the start of the phase P5. During this phase, the amplifier AMP is also reconnected to the capacitor CM, as can be seen in FIG. 8b illustrating the operation of the charge pump PC at the step P5.

Figure 8C:
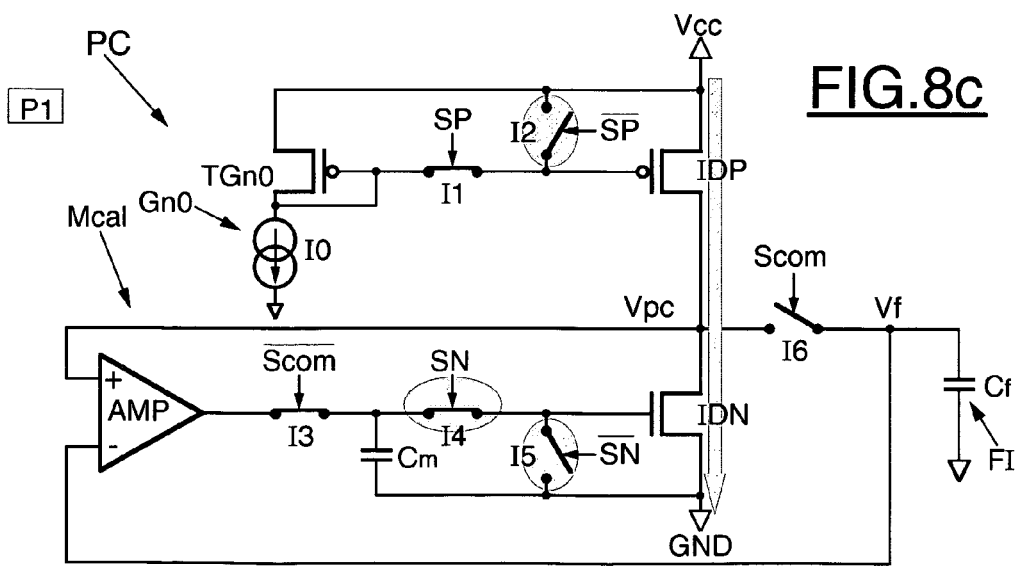

At the end of the phase P5, the system is again in the calibration phase P1, as is illustrated in FIG. 8c. The gate of the transistor TGn0 is then reconnected to the transistor IDP, and also the gate of the transistor IDN to the output of the amplifier AMP. So as to avoid the spurious frequency lines in the frequency spectrum caused by the opening and closing of the switch I6, the delay $\tau_d$ of the delayed signals $F_{refr}$ and $F_{divr}$ is generated to reduce the injections of charge into the capacitor CF.

The time $\tau_d$ is calculated such that $\tau_d=\tau_r+\epsilon_t$. $\tau_r$ corresponds to the opening and closing time of the switch I6, and $\epsilon_t$ corresponds to an additional lapse of time. $\tau_r$ is calculated to reduce the effects of charge injection and to reduce the flow of current in the capacitor $C_f$ by the drain-source and gate-source leakage capacitances when the transistors are turned off. The time $\epsilon_t$ ensures that the switch I6 is really closed during the comparison of the delayed signals $F_{refr}$ and $F_{divr}$.

In this example, the time $\tau_r$ is calculated by means of the ratio of the capacitances of the gate capacitor of the MOS transistor forming the switch I6 and of the capacitor $C_f$ of the filter FI, such that the constraints defined hereinabove are adhered to. By way of example, for a reference frequency $F_{ref}$ of 2.7 MHz, $\tau_d$ is around 20 ns.

Figure 9:
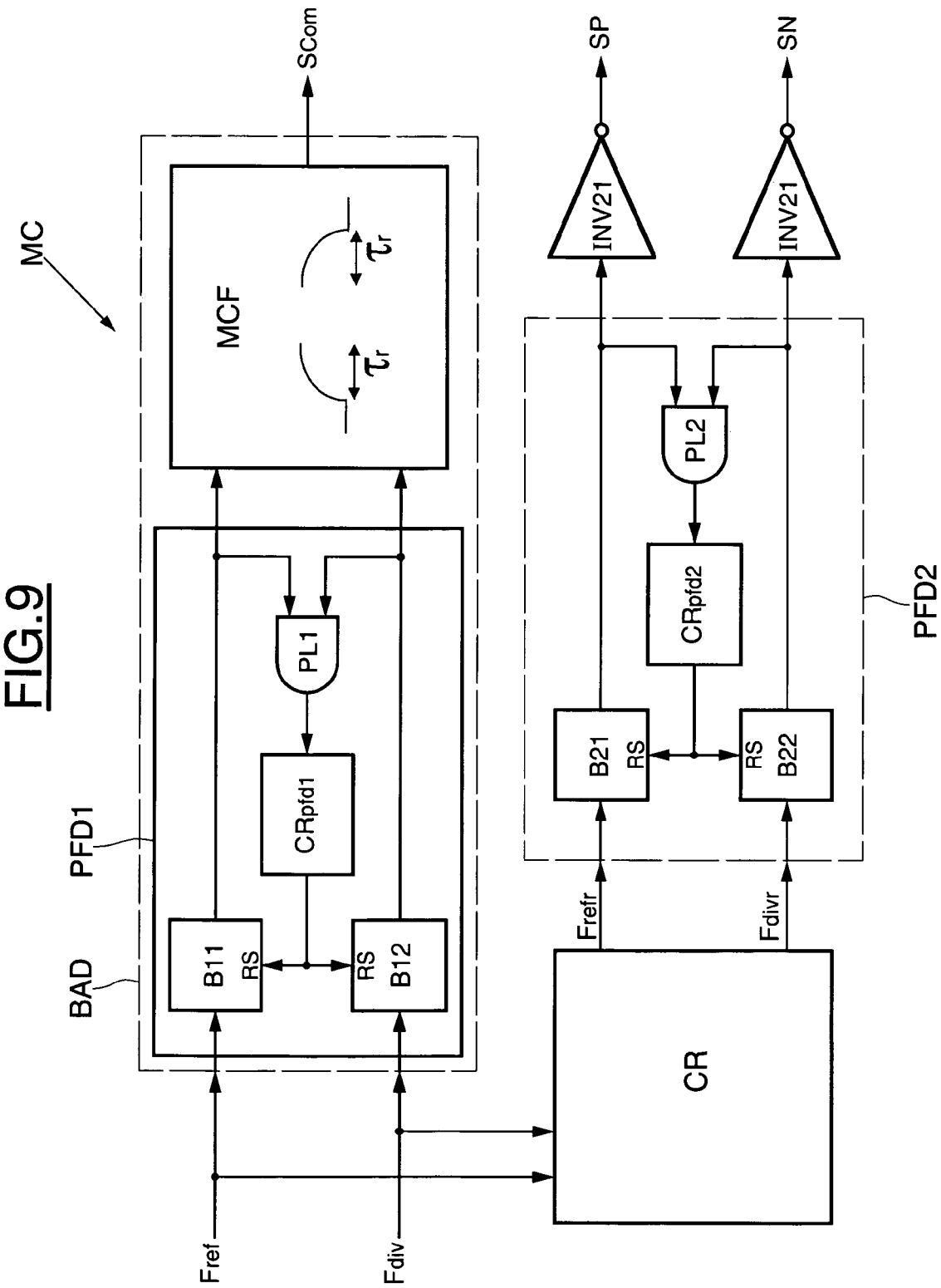
FIG. 9 illustrates in more detail the controller or the control means shown in FIG. 1.

Reference is now made to FIG. 9, which describes in more detail the controller or control means MC, and more particularly the phase/frequency discriminators PFD1 and PFD2. Each of the discriminators PFD1 and PFD2 comprises two flip-flops, B11, B12, and B21, B22, respectively, whose outputs are fed back via an 'AND' logic gate, PL1 and PL2, respectively, the outputs of the logic gates each being connected to a delay cell, $CR_{pfd1}$ and $CR_{pfd2}$, respectively. The delay cells $CR_{pfd1}$ and $CR_{pfd2}$ of each phase/frequency discriminator are connected to the respective reset inputs RS of the flip-flops. The delay times associated with the delay cells $CR_{pfd1}$ and $CR_{pfd2}$ are respectively $\tau_{pfdsw}$ and $\tau_{pfdud}$.

The flip-flops B11 and B12 of the phase/frequency discriminator PFD1 receive the signals $F_{ref}$ and $F_{div}$, respectively, at their inputs. The flip-flops B21 and B22 of the discriminator PFD2 receive the respective delayed signals $F_{refr}$ and $F_{divr}$ at their inputs, respectively corresponding to the signals $F_{ref}$ and $F_{div}$, delayed by a time $\tau_d$ by the delay cell CR. They deliver the control signals SP and SN at their outputs via two inverters INV21 and INV22, respectively. Furthermore, the phase/frequency discriminator PFD1 comprises an edge control module MCF connected to the outputs of the flip-flops B11 and B12. The edge control module MCF allows the switching signal $S_{com}$ to be delivered while at the same time controlling the rise and fall times of the signal such that the latter are equal to a time $\tau_r$.

Figure 10:
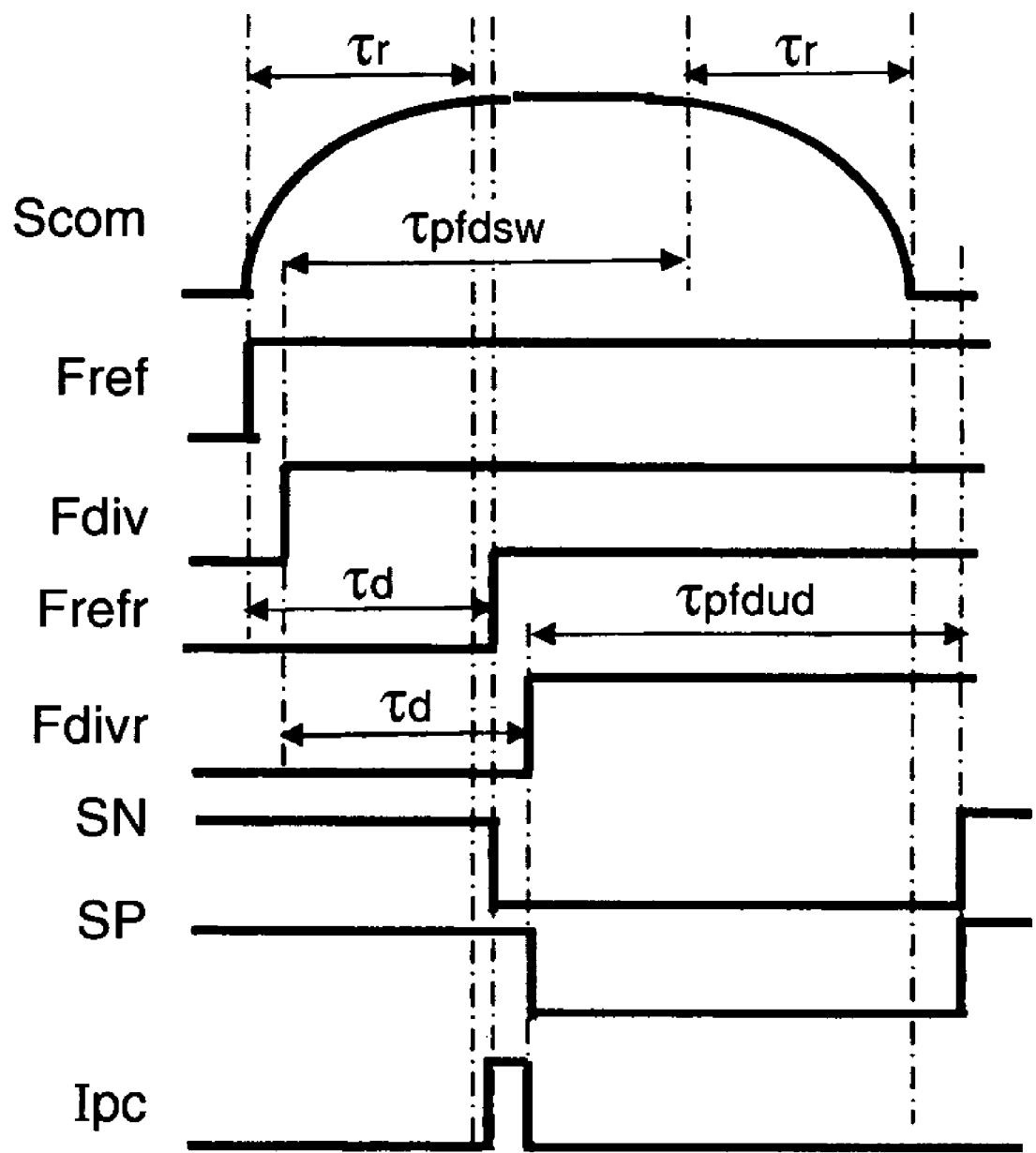
FIG. 10 shows the operational timing diagram of the controller or control means shown in FIG. 9.

As can be seen in the timing diagram in FIG. 10, the times $\tau_r$ and $\tau_d$ are determined such that $\tau_d=\tau_r+\epsilon_t$, and the times $\tau_{pfdud}$ and $\tau_{pfdsw}$ are determined such that $\tau_d+\tau_{pfdud}>\tau_r+\tau_{pfdsw}$. This inequality guarantees that the switching signal $S_{com}$ is already back in the low state when the control signals SN and SP switch to the high state.

Figure 11:
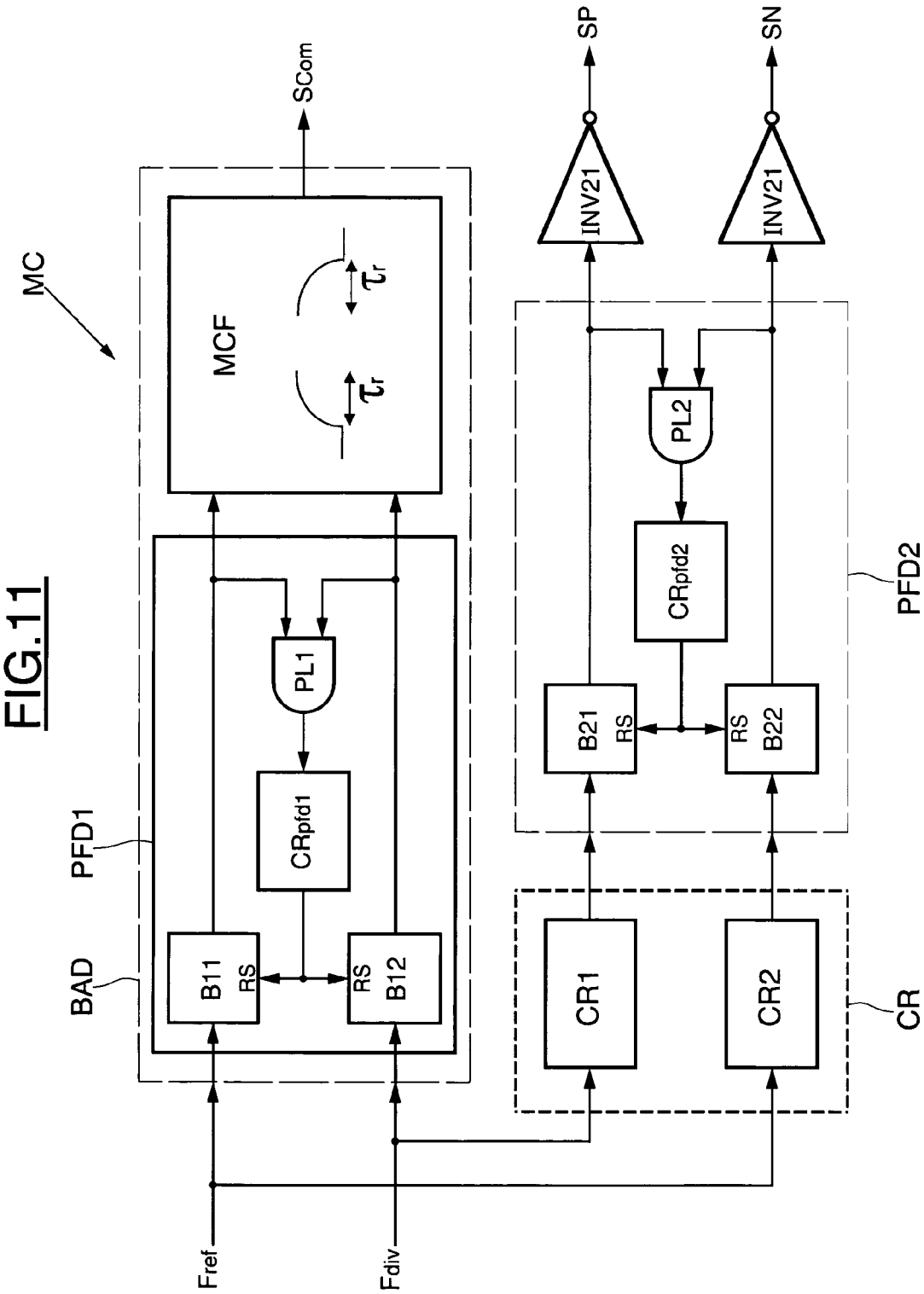
FIG. 11 shows another embodiment of the controller or the control means shown in FIG. 9.

Reference is now made to FIG. 11, which shows a variant of the embodiment shown in FIG. 9. In this variant, the delay cell CR comprises two delay sub-cells CR1 and CR2 associated with the signals $F_{ref}$ and $F_{div}$, respectively. Each of these delay cells delays their input signals by a separate delay $\tau_{d1}$ and $\tau_{d2}$. However, this difference in delay can create a phase variation between the signals $F_{ref}$ and $F_{div}$. This difference generates an additional time during which the switch I6 is closed, since the current sources IDN and IDP are active. This additional time creates additional spurious noise.

Figure 12:
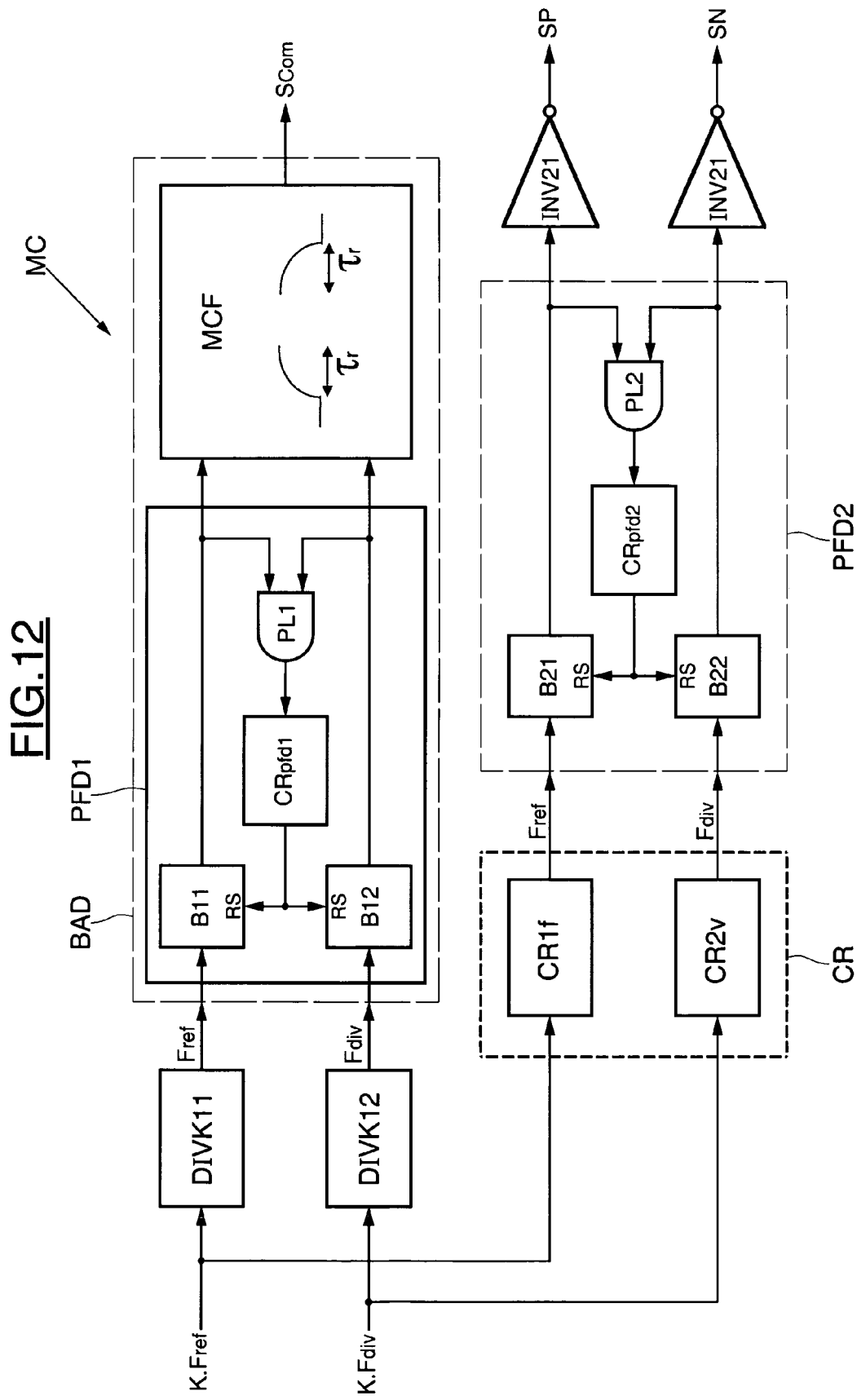
FIG. 12 shows another embodiment of the controller or the control means shown in FIG. 9.

FIG. 12 illustrates another variant of the embodiment shown in FIG. 9. The delay cell CR comprises two delay sub-cells $CR1_f$ and $CR2_v$. Each of these delay cells receives signals $KF_{ref}$ and $KF_{div}$ corresponding to the signals $F_{ref}$ and $F_{div}$ multiplied by a coefficient K. The signals $KF_{ref}$ and $KF_{div}$ are also delivered to two dividers by K, DIVK11, and DIVK12, which output the reference signal $F_{ref}$ and division signal $F_{div}$ to the flip-flops B11 and B12 of the phase/frequency discriminator PFD1.

Each of the delay sub-cells, $CR1_f$ and $CR2_v$ are associated with separate delay times, $\tau_{d1}$ and $\tau_{d2}$, such that $\tau_{d1}=1/KxF_{ref}$ and $\tau_{d2}=1/KxF_{div}$. Thus, given that $F_{div}$ is variable, the time $\tau_{d2}$ is variable. In contrast, the time $\tau_{d1}$ is fixed. When the reference frequency $F_{ref}$ is equal to the frequency of the divider $F_{div}$, then $\tau_{d1}$ is equal to $\tau_{d2}$. It is then possible to improve the stability of the phase-locked loop of this embodiment by adding a delay into the feedback loop (not shown).

That which is claimed is:

1. A phase-locked loop device comprising:
   two inputs for receiving two input signals;
   a charge pump having two opposing currents flowing therein, said charge pump connected between said two inputs;

a filter;
a calibrator, activated by an activation signal and deactivated by a deactivation signal, for equalizing an output voltage of the charge pump with an input voltage of the filter and amplitudes of the two opposing currents flowing in the charge pump; and
a controller comprising
a delay cell for delivering two delayed signals based upon the two input signals,
a control circuit for delivering, respectively and successively, and in the presence of the two delayed signals, two interruption signals to the charge pump to cause respective, successive interruptions of the two opposing currents, and
an activation/deactivation unit for delivering the activation signal prior to each occurrence of a first one of the two input signals, and the deactivation signal following the interruptions.

2. The phase-locked loop device according to claim 1 wherein the calibrator comprises an amplifier having positive and negative inputs respectively connected to an output node of the charge pump, and to an input of the filter, and a first switch controlled by the activation signal.

3. The phase-locked loop device according to claim 2 wherein the calibrator further comprises a negative current source, a second switch controlled by the deactivation signal and a third switch controlled by one of the interruption signals, the second and third switches for connecting and disconnecting an output of the amplifier to and from a control input of the negative current source.

4. The phase-locked loop device according to claim 3 wherein the activation/deactivation unit is connected to an input of the charge pump and comprises a first phase/frequency discriminator and an edge control module for delivering the activation signal and deactivation signal.

5. The phase-locked loop device according to claim 4 further comprising a control unit connected to the input of the charge pump and including a second phase/frequency discriminator connected to an output of the delay cell.

6. The phase-locked loop device according to claim 5 wherein the charge pump comprises a first transistor configured as a current source delivering a first current and connected between a power supply voltage and an output of the charge pump; and further comprising a fourth switch, a fifth switch, and a controllable current source; and wherein a control input of the first transistor is connected via the fourth switch to the power supply voltage and via a fifth switch to the controllable current source, the fourth and fifth switches controlled by one of the interruption signals.

7. The phase-locked loop device according to claim 6 further comprising a sixth switch; and wherein the charge pump further comprises a second transistor configured as a current source, delivering a second current and connected between the output of the charge pump and a reference voltage, a control input connected to the reference voltage via the sixth switch controlled by the other interruption signal.

8. The phase-locked loop device according to claim 1 wherein the delay cell comprises two modules for generating two different delays for each of the input signals.

9. The phase-locked loop device according to claim 1 wherein the delay cell comprises two modules for generating delays of each of the input signals, one of the delays being fixed and the other being adjustable.

10. The phase-locked loop device according to claim 6 wherein the first transistor comprises a PMOS transistor.

11. The phase-locked loop device according to claim 7 wherein second transistor comprises an NMOS transistor.

12. A phase-locked loop device comprising:
two inputs for receiving two input signals;
a charge pump having two opposing currents flowing therein, said charge pump connected between said two inputs;
a filter;
a calibrator, activated by an activation signal and deactivated by a deactivation signal, the calibrator for equalizing an output voltage of the charge pump with an input voltage of the filter and amplitudes of the two opposing currents flowing in the charge pump;
said calibrator comprising
an amplifier having positive and negative inputs are respectively connected to an output node of the charge pump, to an input of the filter, and a first switch controlled by the activation signal; and
a controller comprising
a delay cell having two distinct modules for generating two different delays for each of the input signals, and for delivering two delayed signals based upon the two input signals,
a control circuit for delivering, respectively and successively, and in the presence of the two delayed signals, two interruption signals to the charge pump to cause respective, successive interruptions of the two opposing currents, and
an activation/deactivation unit for delivering the activation signal prior to each occurrence of a first of the two input signals, and the deactivation signal following the interruptions.

13. The phase-locked loop device according to claim 12 wherein the calibrator further comprises a negative current source, a second switch controlled by the deactivation signal and a third switch controlled by one of the interruption signals, the second and third switches for connecting and disconnecting an output of the amplifier to and from a control input of the negative current source.

14. The phase-locked loop device according to claim 13 wherein the activation/deactivation unit is connected to an input of the charge pump and comprises a first phase/frequency discriminator and an edge control module for delivering the activation signal and deactivation signal.

15. The phase-locked loop device according to claim 14 further comprising a control unit connected to the input of the charge pump and including a second phase/frequency discriminator connected to an output of the delay cell.

16. The phase-locked loop device according to claim 15 wherein the charge pump comprises a first transistor configured as a current source delivering a first current and connected between a power supply voltage and an output of the charge pump; and further comprising a fourth switch, a fifth switch, and a controllable current source; and wherein a control input of the first transistor is connected via the fourth switch to the power supply voltage and via a fifth switch to the controllable current source, the fourth and fifth switches controlled by one of the interruption signals.

17. The phase-locked loop device according to claim 16 further comprising a sixth switch; and wherein the charge pump further comprises a second transistor configured as a current source, delivering a second current and connected between the output of the charge pump and a reference voltage, a control input connected to the reference voltage via the sixth switch controlled by the other interruption signal.

18. A method for correcting a phase difference between a first input signal and a second input signal of a phase-locked loop including a charge pump connected to a filter, the method comprising:

carrying out a calibration phase prior to an occurrence of at least one of the first input signal and the second input signal in which an input of the filter is disconnected from an output of the charge pump, an output voltage from the charge pump is equalized with an input voltage of the filter, and amplitudes of two opposing currents flowing in the charge pump are equalized;

reconnecting the input of the filter to the output of the charge pump during two respective occurrences of the first input signal and the second input signal; and generating a first delay signal and a second delay signal that are delayed with respect to the first input signal and the second input signal, in response to which the two opposing currents are successively interrupted, respectively, before the calibration phase is recommenced.

19. The method according to claim 18 wherein the filter disconnecting and connecting from and to the charge pump occurs gradually over a time period less than a delay of at least one of the first delay signal and the second delay signal.

* * * * *

UNITED STATES PATENT AND TRADEMARK OFFICE
CERTIFICATE OF CORRECTION

| | |
|---|---|
| PATENT NO. | : 7,265,636 B2 |
| APPLICATION NO. | : 11/304382 |
| DATED | : September 4, 2007 |
| INVENTOR(S) | : Dedieu et al. |

It is certified that error appears in the above-identified patent and that said Letters Patent is hereby corrected as shown below:

Title Page item (56)    Insert: -- 2003/0146793    08/2003
                                Yamagishi et al. ................... 331/17 --

Signed and Sealed this

Twentieth Day of May, 2008

JON W. DUDAS
*Director of the United States Patent and Trademark Office*